United States Patent [19]

Forster et al.

[11] Patent Number: 4,746,874
[45] Date of Patent: May 24, 1988

[54] CIRCUIT LAYOUT FOR SIGNAL AMPLIFICATION

[75] Inventors: Gerhard Forster; Konrad Hirsch, both of Ulm, Fed. Rep. of Germany

[73] Assignees: Licentia Patent-Verwaltungs-GmbH, Frankfurt; TELEFUNKEN electronic GmbH, Heilbronn, both of Fed. Rep. of Germany

[21] Appl. No.: 916,223

[22] Filed: Oct. 7, 1986

[30] Foreign Application Priority Data

Oct. 8, 1985 [DE] Fed. Rep. of Germany ....... 3535882

[51] Int. Cl.⁴ .............................................. H03F 3/45
[52] U.S. Cl. ..................................... 330/252; 330/261
[58] Field of Search .................... 330/252, 254, 261, 9

[56] References Cited

U.S. PATENT DOCUMENTS

| 3,872,247 | 3/1975 | Saville et al. | 330/138 |
| 4,300,102 | 11/1981 | Inoue | 330/254 |
| 4,405,901 | 9/1983 | Taguchi et al. | 330/261 |
| 4,464,632 | 8/1984 | Yoshihisa et al. | 330/254 |
| 4,527,128 | 7/1985 | Bittner | 330/9 |

FOREIGN PATENT DOCUMENTS 2027306 2/1980 United Kingdom .
2151887 7/1985 United Kingdom .

OTHER PUBLICATIONS

U. Tietze, Ch. Schenk "Halbleiter-Schaltungstechnik", 3, Edition, Springer Verlag Berlin, 1974, pp. 294–295.

Primary Examiner—Gene Wan
Attorney, Agent, or Firm—Spencer & Frank

[57] ABSTRACT

In a circuit layout for signal amplification with the aid of a differential amplifier and signal coupling via a first capacitor, it is proposed, in order to prevent unacceptable operating point displacements into the non-linear area of the amplifier layout in the event of temporarily interfering high-level signals, that one input of the differential amplifier connected to the signal source via the first capacitor be connected via a first resistor, and the other input via a second resistor, jointly via an electronic switch controllable by a comparator, to reference potential. A reference voltage source is connected to one input of the comparator, and the signal source to the other input of the comparator via an RC element, whose time constant is of the same order of magnitude as the time constant formed by the first capacitor and the first resistor.

5 Claims, 3 Drawing Sheets

CIRCUIT LAYOUT FOR SIGNAL AMPLIFICATION

BACKGROUND OF THE INVENTION

The invention relates to a circuit layout for signal amplification of the type stated in the preamble of claim 1.

Linear operation amplifiers with high amplification must be capacitively coupled if the signal D.C. voltage is not defined or is so great that the amplifier limits on one side. With capacitive coupling, the centre voltage, which is superposed by the A.C. voltage, is applied to the amplifier input. The transmission of the A.C. voltage is influenced by the time constant $\tau = R_e \cdot C$ (where C=coupling capacity, $R_e$=resistance value of the input resistance of the amplifier). To minimize signal distortions, the time constant must exceed the largest signal period. On the other hand, in order for the amplifier to return to its set operating point in finite time in the event of a high-amplitude interference signal, the time constant cannot be of arbitrary size.

Particularly in cases where the signal voltage is proportional to a light intensity, the result is very high dynamics and interference signals which may exceed the useful signal by a factor of 1000, for example. Single interference signals of this type lead to a high displacement current flowing in the coupling capacitor for a short period as a consequence of the finite time constant, with the result that the amplifier is overmodulated with opposite polarity following the interfering pulse until the capacitor has been reloaded. Interference of this nature may occur periodically during image transmission. In this case, the amplifier is driven to its limit on both sides, depending on the amplitude and the duty cycle of the interference signals. Information contained in the low-level signal is completely lost thereyb, as no suitable rest operating point is set at the amplifier input.

To reduce the influence of large interference signals, D.C. amplifiers, for example logarithmic amplifiers, with diodes in the negative feedback branch are frequently used. This reduces the amplification for high-level signals, but does not eliminate the shift in the operating point caused by high-level signal pulses in the case of capacitive signal coupling. This greatly reduces the amplification for low-level signals following an interference pulse until the operating point has reset.

SUMMARY OF THE INVENTION

The object underlying the invention is to provide a circuit which permits an ungrounded linear amplification of low-level signals without involving a displacement of the operating point from the set operating point as a result of interfering high-level signals which are not to be transmitted in linear mode. In particular, a circuit layout is to be provided that is monolithically integratable in bipolar design onto as small a chip area as possible.

The object is attained in a circuit layout of the type stated in the preamble of claim 1 by the features stated in the characterizing clause of claim 1.

Due to the fact that the input resistance of the differential amplifier gest high-impedance when a preset signal level is exceeded, the coupling capacitor is not reloaded, with the result that the circuit layout shows the original linear low-level signal amplification immediately after overmodulation is eliminated.

Further advantageous embodiments of the invention can be found in the sub-claims. In the embodiment of the invention according to claim 2, a preset maximum voltage appears at the amplifier output when the circuit layout is overmodulated to indicate that a high-level signal is present. Furthermore, the output signal is advantageously transient-free. In the embodiment of the invention according to claim 3, the input voltage range to be linearly amplified can easily be set in dependence upon the selected signal amplification. By means of an emitter follower connected upstream according to claim 4, the input resistance of the circuit layout not only increases, but it is also independent of the amplification setting. The embodiment of the invention according to claim 5 serves to compensate the input static current of the amplifier which is drawn from the coupling capacitor for the duration of the high-level signal.

The invention will now be described in greater detail, with reference to embodiments and drawings.

DESCRIPTION OF THE PREFERRED EMBODIMENTS

Figure 1:
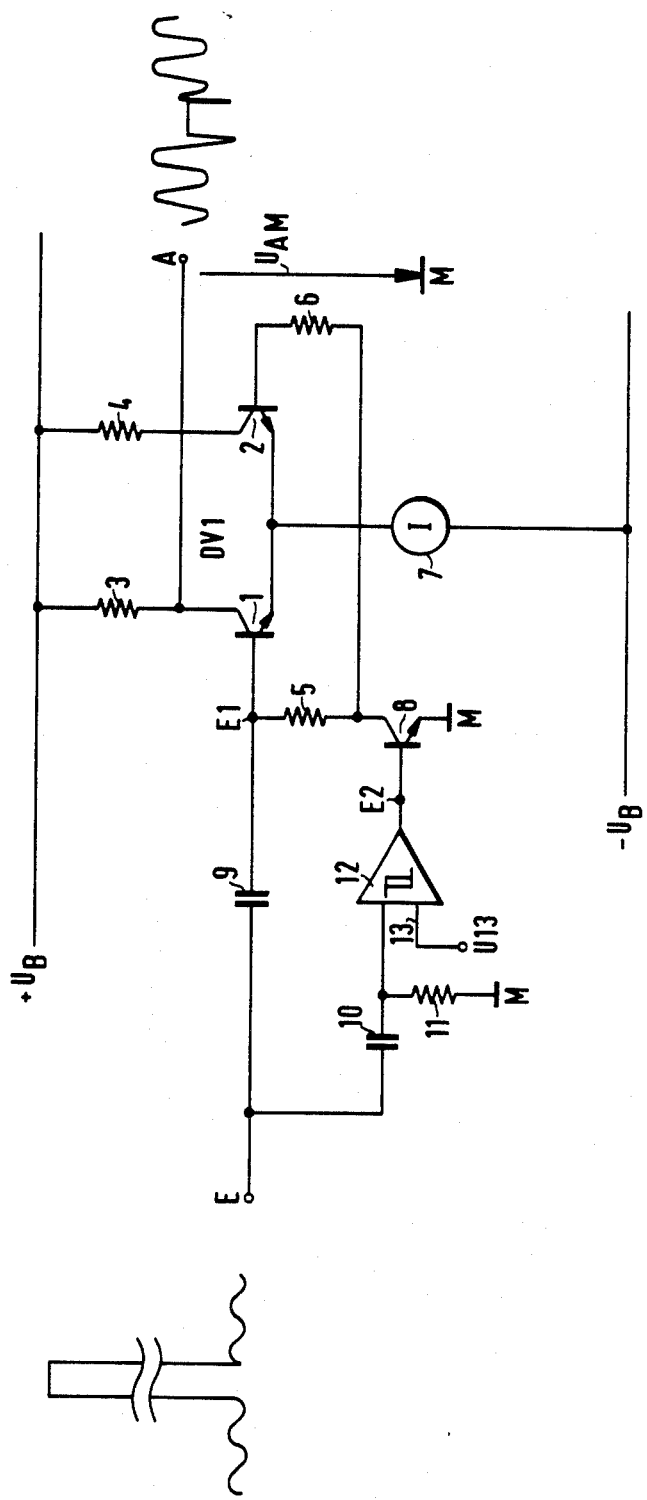
FIG. 1 shows a circuit layout according to the invention with a differential amplifier.

FIG. 1 shows in the simplest form a circuit layout for signal amplification by means of a differential amplifier DV1 comprising transistors 1 and 2 and collector resistors 3 and 4, and emitter current source 7. Signal coupling is effected via input E and capacitor 9. Input E1 of the differential amplifier, to which capacitor 9 is connected, is also connected via a resistor 5, and the other input via a resistor 6, jointly via an electronic switch designed in the embodiment as transistor 8, to reference potential M.

Transistor 8 provided as an electronic switch is controllable by a comparator 12. A reference voltage source 13 is connected to one input of the comparator, and an RC element to the other input, said element comprising resistor 11 and capacitor 10, where the capacitor is connected between one input of the comparator and the input of the circuit layout In normal operation, transistor 8 is conductive and the input resistance of the circuit layout measured between terminals E1 and M is determined by resistors 5 and 6, which meet the condition $$R_8 << (R_5, R_6) << R_{id}$$

where $R_8$ is the interconnecting resistor of transistor 8 and $$R_{id} = 2 \cdot \left( R_B + \beta \cdot \frac{U_T}{I_7} \right)$$

is the differential input resistance of the differential amplifier without resistors 5 and 6. Furthermore, $R_B$ is the internal base resistance of a transistor 1 or 2, $U_T$ the temperature voltage of a transistor ($\approx 26$ mV at 25° C.), and $I_7$ the current of emitter current source 7.

Capacitor 9 is for ungrounded signal coupling. The input signal is coupled via a second capacitor 10 into a level detector designed as comparator 12.

The time constants $R_{11} \cdot C_{10}$ and $R_5 \cdot C_9$ are expediently of identical size and so selected that they are approximately the same size as the signal period of the useful signal with the lowest frequency to be transmitted. For rapid operating point setting to the set operating point, they should not be selected unduly large.

In the case of high-level signal interference, for example, with signals 40 dB above the useful signal, comparator 12 blocks transistor 8. Since resistors $R_5$ and $R_6$ are very much smaller than the differential input resistance of transistors 1 and 2, the differential amplifier stage is subjected to common-mode triggering, with the input resistance of the differential amplifier between terminals E1 and the reference line M assuming the high value $$R_{E1M} = \beta \cdot R_7 << R_5$$

on account of the high differential resistance $R_7$ of current source 7. The result is a very large time constant $C_9 \cdot R_{E1M}$, which prevents a displacement current in capacitor $C_9$ during high-level signal modulation.

If the declining edge of the high-level signal falls below the comparator threshold, transistor 8 becomes conductive again, and the differential amplifier stage is again operated in linear mode without operating point displacement or capacitance reloading of the capacitor 9. The comparator threshold $U_{13}$ at input 13 of comparator 12 is best set in such a way that the time constant is switched over shortly before the input signal drives the differential amplifier output A to its limit.

The differential amplifier stage DV1 is best dimensioned, for operating time reasons, so that transistors 1 and 2 are not driven into saturation by the amplitude of an anticipated maximum high-level signal.

The circuit layout is thus in a position to amplify low-level signals in linear mode without operating point displacement by high-level signals. The output signal $U_{AM}$ at output A of the amplifier, however, drops, when a high-level signal is present and when the maximum voltage has been reached, to the output voltage corresponding to the common-mode amplification $$v = R_3/(2 \cdot R_7)$$

which furthermore leads to transients.

As a rule, the information "high-level signals" is required at the output of the amplifier, so that it is best for a preset maximum level to be set at the amplifier output for the duration of a high-level signal applied at the input. This is achieved in the embodiment of the circuit layout according to FIG. 2. In this case, a second differential amplifier DV2 having two transistors 15 and 16 is connected to the collectors of transistors 1 and 2. For the two transistors, an emitter current source 20 is provided which is connectable in a first switching condition to the interconnected emitters of the two transistors 15 and 16, and in a second switching condition to output A' of the second differential amplifier DV2, via a change switch controlled by comparator 12 via input E2', said switch comprising in the embodiment the two transistors 18 and 19.

A resistor 21 between the line conducting the operating voltage $+U_B$ and the connection point of the two collector resistors 3 and 4 of the first differential amplifier serves, in a manner known per se, to shift the potential of the collector voltage of transistors 1 and 2 and thereby the base voltages of transistors 15 and 16.

In the normal case, i.e. with a low-level signal, transistors 8 and 18 are conductive while transistor 19 is blocked. The current of current source 20 then flows through transistors 15 and 16 of the second differential amplifier DV2 and effects a linear amplification of the second differential amplifier too. The input resistance $R_{E1M}$ between input terminal E1 and reference line M is determined by resistor 5.

An overmodulation high-level signal first drives the amplifier output A' almost to its limit. When the input voltage $U_{E1M}$ associated with the limit is reached, transistors 8 and 18 are blocked and 19 is opened. The entire current of current source 20 then flows through resistor 17 in the collector of transistor 16 and maintains the output voltage $U_{AMmax}$, corresponding to the limit condition, at a constant level until switchover to the linear operating condition takes place again once the high-level signal has disappeared.

The amplifier input is, as already described, high-impedance for the duration of the high-level signal. The amplifier output signal does not, however, show the input signal multiplied by the common-mode amplification, but the maximum output level preset by the operating voltages $+U_B$, $-U_B$, current source 20 and resistor 17. When transistors 8 and 18 are triggered simultaneously by comparator 12, the output signal $U_{AM}$ is advantageously transient-free.

Figure 2:
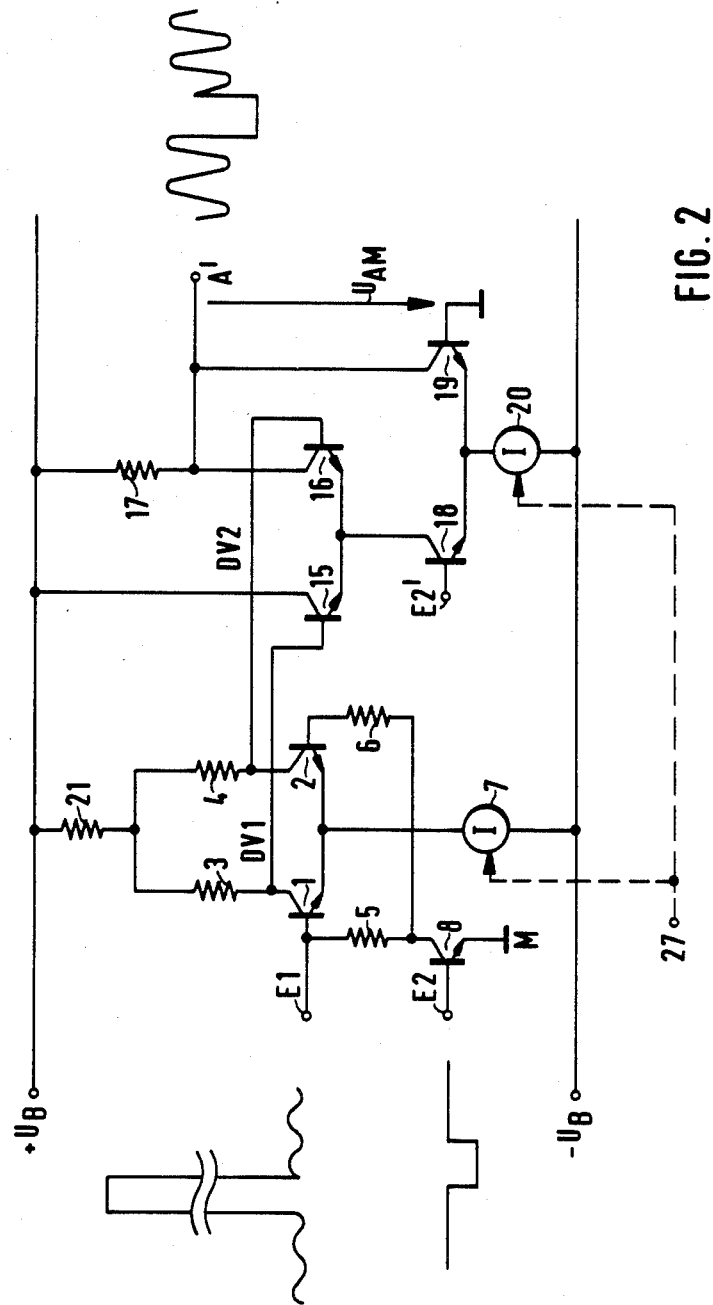
FIG. 2 shows a circuit layout according to the invention with a second switchable differential amplifier.

If, as shown in FIGS. 1 and 2, there are no resistors in series with the emitters of transistors 1, 2, 15 and 16, amplification of the circuit arrangement can be set using controllable current sources 7 and 20. This, however, causes a change in the input voltage value at which the limit occurs at amplifier output A'. Since comparator 12 switches over when the constant comparator threshold $U_{13}$ is exceeded, said threshold being selected identical to the maximum permissible input voltage, the dynamics for linear transmission are only optimum when the signal amplifier is discretely amplified.

When the amplification of the signal amplifier is set low, switchover to high-level signal takes place at the input signal levels which could still be transmitted in linear mode. This leads to a voltage jump at output A' at every switchover. On the other hand, if the signal amplifier has a high amplification setting, the signal amplifier can be driven to its limit even with a low-level signal without the desired switchover taking place.

Figure 3:
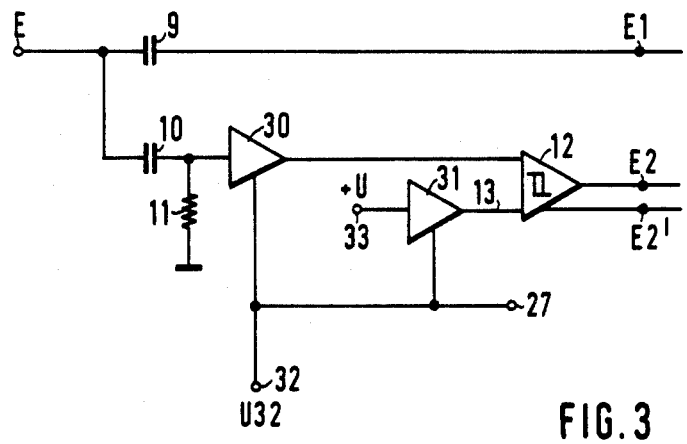
FIG. 3 shows a circuit diagram of the comparator with preamplifier.

These drawbacks are avoided with the circuit layout according to FIG. 3 by adapting the comparator threshold $U_{13}$ to the appropriate maximum input voltage $U_{E1max} = U_{AMmax}/V$ permissible and thus to the amplification of the signal amplifier.

In FIG. 3, the amplifier input is shown between input terminal E and terminals E1 and E2. Elements the same as in FIG. 1 are numbered identically. As can be seen, a preamplifier 30 is connected upstream of the signal input of comparator 12 and a preamplifier 31 upstream of the reference input of comparator 12. Both preamplifiers 30 and 31 are controllable in the same way as the signal amplifier (DV1 with DV2) as regards amplification. For this purpose, their control inputs are connected up and are controllable by a settable control voltage $U_{32}$ via a common line 32 connected to control input 27 of current sources 7 and 20 (FIG. 2).

To ensure that preamplifiers 30 and 31 have as identical as possible an amplification and as identical as possible an amplification development during amplification control, the preamplifiers are best constructed in the same way as the signal amplifier, but with resistors 5 and 6 of differential amplifier DV1 being connected directly to reference potential M and with the controllable current source 20 being connected directly to the emitters of transistors 15 and 16, omitting transistors 18 and 19 of differential amplifier DV2. In the case of preamplifier 30, resistance 11 at its input (FIG. 3) then corresponds, for example, to resistance 5 of differential amplifier DV1 in FIG. 2.

Preamplifier 31 has the task of adapting the reference voltage and thus the switchover point to the respective maximum output voltage $U_{AM}$ of the signal amplifier, said reference voltage depending on the amplification setting, the operating voltage and the ambient temperature; for example, the current of current source 20 of the second differential amplifier DV2 is increased when a greater amplification is set. In the case of signal amplification cutout at a high-level signal and thereby conducting transistor 19, the voltage drop is then greater due to the higher current of current source 20 at resistor 17, and the voltage $U_{AM}$ thereby lower. Consequently, the reference voltage for comparator 12 must be lowered when a switchover is made in order to avoid transients. That means that preamplifier 31 must be switched such that its output (D.C.) voltage decreases when a higher amplification is set.

The input of amplifier 31 is at a constant potential designated $+U$ in the Figure. The amount of constant input voltage $+U$ is selected so that output 13 of preamplifier 31 is kept in the limit condition regardless of the amplification setting. That means that the transistor corresponding to the differential amplifier DV2 in preamplifier 31 is always set to be conductive.

In addition, the output voltage of preamplifier 31 is slightly smaller (approx. 5–10%) than the maximum output voltage of preamplifier 30 and thus of the signal amplifier.

The input voltage range of the signal amplifier which is to undergo linear amplification can be advantageously set using the amplification setting via voltage $U_{32}$. The circuit layout according to FIG. 2, supplemented with the circuit according to FIG. 3, then operates, independently of the amplification set via voltage $U_{32}$ and independently of the operating temperature and the supply voltage, in linear mode until the maximum output level is reached at output A', and, when this level has been reached, switches over the input time constant of the signal amplifier.

Figure 4:
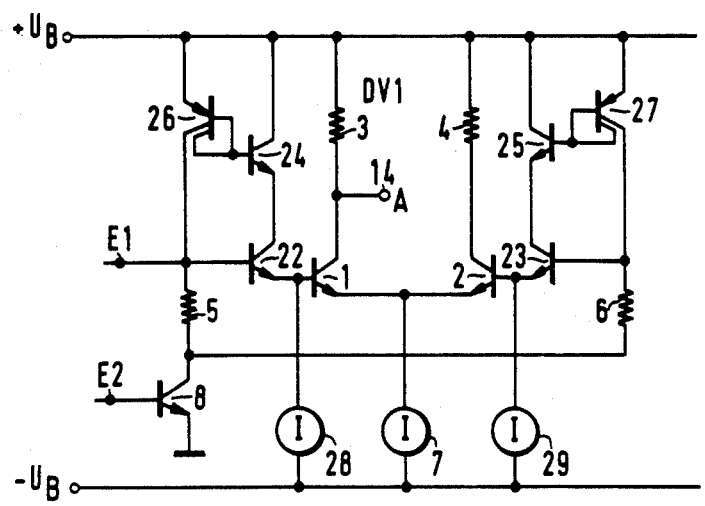
FIG. 4 shows a circuit diagram of the amplifier input with emitter follower and current mirror for base current compensation.

In FIG. 4, an advantageous embodiment is shown of the first differential amplifier stage DV1 containing transistors 1 and 2. An emitter follower 22 and 23 is connected upstream of transistors 1 and 2, respectively, and resistors 5 and 6 to the respective base electrodes of the emitter followers. The input resistance of the first differential amplifier is thereby advantageously increased, regardless of the amplification and negligibly in comparison with resistors 5 and 6. The emitter followers also reduce the input static current of the amplifier. Furthermore, they reduce, when transistor 8 is blocked, the input static current of transistors 1 and 2, which would cause an undesired reloading process in the capacitor 9, and thus an operating point shift, if a high-level signal were to be applied for any length of time.

Furthermore, FIG. 4 shows that an additional transistor 24 and 25, respectively, is connected in the collector line of each emitter follower 22 and 23, the base connections of said transistors being connected to a current mirror circuit 26 and 27, respectively, connected to the power supply line conducting $+U_B$ voltage. The collector of current mirror circuit 26 and 27 respectively, carrying the mirrored current, is connected to the base of the corresponding emitter follower 22 and 23 respectively. Since, for example, transistor 24 has the same base current as transistor 22, its base current mirrored above the current mirror 26 effects compensation of the base current of transistor 22, so that the set operating point is subsequently reached practically without deviation even after lengthy blocking of transistor 8 by a high-level signal.

What is claimed is:

1. A circuit layout for signal amplification by means of a differential amplifier (DV1) and a first capacitor (9) at one of its two inputs for signal coupling,
    wherein one input of the differential amplifier (DV1) to which the first capacitor (9) is connected, is connected via a first resistor (5), and the other input of the differential amplifier (DV1) is connected via a second resistor (6), jointly via an electronic switch (8), to reference potential (M),
    the electronic switch (8) is controllable by a comparator (12), a reference voltage source ($U_{13}$) is connected to one input of the comparator (12) and an RC element (11, 10) to the other input,
    the resistor (11) of the RC element is connected to reference potential (M) and the capacitor (10) of the RC element to the input (E) of the circuit layout,
    the time constant of the RC element (10, 11) of the comparator (12) is of the same order of magnitude as the product of the capacitance of the first capacitor (9) and the resistance value of the first resistor (5), and the time constant formed by the first capacitor (9) and the first resistor (5) is substantially smaller than the time constant formed by the first capacitor (9) and the input resistance of the differential amplifier (DV1).

2. A circuit layout according to claim 1, wherein the differential amplifier (first differential amplifier DV1) contains two transistors (1, 2) with a common emitter current source (7) and with identically sized collector resistors (3, 4),
    a second differential amplifier (DV2) with two transistors (15, 16) is coupled to the collectors of the two transistors (1, 2) of the first differential amplifier (DV1),
    a second emitter current source (20) is provided for the two transistors (15, 16) of the second differential amplifier (DV2), said source (20) being connectable via a change switch (18, 19) controlled by the comparator (12) to the interconnected emitters of both transistors (15, 16) of the second differential amplifier (DV2) in a first switching condition and to the output (A') of the second differential amplifier (DV2) in a second switching condition.

3. Circuit layout according to claim 2, wherein the common emitter current source (7) and the second emitter current source (20) are designed as controllable current sources and the amplification of the signal amplifier formed by the first and second differential amplifiers (DV1, DV2) is settable by mans of the controllable current sources (7, 20), a first preamplifier (30) is connected upstream of the signal input of the comparator (12) and a second preamplifier (31) upstream of the reference input of comparator (12), both preamplifiers (30, 31) are controllable in respect of amplification in the same way as the signal amplifier (DV1, DV2), the maximum output voltage of preamplifier (30) is identical to that of the signal amplifier (DV1, DV2) and that of preamplifier (31) is slightly smaller than that of the signal amplifier (DV1, DV2) and the output (13) of preamplifier (31) is held in the limit condition via its input (33) regardless of the amplification setting.

4. A circuit layout according to claim 2, wherein an emitter follower (22, 23) is connected upstream of the transistors, (1, 2) of the first differential amplifier (DV1), and the first and second resistors (5, 6) are connected to the respective base electrodes of the emitter followers (22, 23).

5. A circuit layout according to claim 4, wherein an additional transistor (24) is connected into the collector line of an emitter follower (22), the basis of said transistor being connected to a current mirror circuit (26) connected to the current supply line ($+U_B$) of the collector, and the collector of the current mirror circuit (26) carrying the mirrored current is connected to the base of the emitter follower (22).

* * * * *